(12) United States Patent
Koelper et al.

(10) Patent No.: US 11,371,883 B2
(45) Date of Patent: Jun. 28, 2022

(54) SEMICONDUCTOR LIGHT SOURCE, OPERATING METHOD AND SPECTROMETER

(71) Applicant: OSRAM OLED GmbH, Regensburg (DE)

(72) Inventors: Christopher Koelper, Regensburg (DE); Carola Diez, Sinzing (DE); Tim Boescke, Regensburg (DE); Thomas Kippes, Neumarkt (DE); Melanie Sternecker, Dingolfing (DE); Daniel Dietze, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 98 days.

(21) Appl. No.: 16/754,754

(22) PCT Filed: Oct. 9, 2018

(86) PCT No.: PCT/EP2018/077508
§ 371 (c)(1),
(2) Date: Apr. 9, 2020

(87) PCT Pub. No.: WO2019/072867
PCT Pub. Date: Apr. 18, 2019

(65) Prior Publication Data
US 2020/0309597 A1    Oct. 1, 2020

(30) Foreign Application Priority Data

Oct. 9, 2017 (DE) .................... 10 2017 123 414.4
Jul. 26, 2018 (DE) .................... 10 2018 118 079.9

(51) Int. Cl.
*G01J 3/02* (2006.01)
*G01J 3/10* (2006.01)
(Continued)

(52) U.S. Cl.
CPC ............ *G01J 3/108* (2013.01); *G01J 3/0272* (2013.01); *G01J 3/32* (2013.01); *H01L 25/0655* (2013.01); *H01L 25/167* (2013.01); *H01L 27/156* (2013.01)

(58) Field of Classification Search
CPC .. G01J 3/108; G01J 3/0272; G01J 3/32; G01J 2003/2806; G01J 3/00; G01J 2003/104;
(Continued)

(56) References Cited

U.S. PATENT DOCUMENTS 9,448,114 B2    9/2016  Goldring et al.
2007/0182960 A1  8/2007  Jayaraman
(Continued)

FOREIGN PATENT DOCUMENTS

CN    105628635 A     6/2016
WO    2004063681 A2   7/2004
(Continued)

OTHER PUBLICATIONS

Larsson A., "Advances in VCSELs for Communicating and Sensing", IEEE Journal of Selected Topics in Quantum Electronics, Nov. 1, 2011, 1552-1567, vol. 17, No. 6, IEEE Service Center, Piscataway, NJ, US.
(Continued)

*Primary Examiner* — Abdullahi Nur
(74) *Attorney, Agent, or Firm* — Viering, Jentschura & Partner mbB

(57) ABSTRACT

A semiconductor light source configured for a spectrometer may include at least one multipixel chip, at least one color setting component disposed optically downstream of at least one of emission region, and a drive unit. The color setting component may be configured for altering a spectral emission behavior of assigned emission regions. The drive unit may be configured to operate a plurality of mutually inde-
(Continued)

pendently drivable emission regions successively, such that during operation thereof at least three spectrally narrowband individual spectra are emitted successively by the plurality of mutually independently drivable emission regions together with the associated color setting component from which individual spectra a total spectrum emitted by the semiconductor light source is constituted.

20 Claims, 9 Drawing Sheets

(51) Int. Cl.
    *G01J 3/32*     (2006.01)
    *H01L 25/065*     (2006.01)
    *H01L 25/16*     (2006.01)
    *H01L 27/15*     (2006.01)

(58) Field of Classification Search
    CPC ...... G01J 3/10; H01L 25/0655; H01L 25/167; H01L 27/156; H01L 33/50; H01L 27/15
    See application file for complete search history.

(56) References Cited

U.S. PATENT DOCUMENTS

2009/0154137 A1     6/2009    Bierhuizen et al.
2013/0155402 A1*   6/2013    Walton ................. G01J 3/0218
                                                      356/301

FOREIGN PATENT DOCUMENTS

WO       20150004213 A1    1/2015
WO        2016111308 A1    7/2016

OTHER PUBLICATIONS

German search report issued for the corresponding DE application No. 10 2018 118 079.9, dated Aug. 3, 2018, 6 pages (for informational purposes only).

International search report issued for the corresponding PCT application No. PCT/EP2018/077508, dated May 24, 2019, 24 pages (for informational purposes only).

\* cited by examiner

A)

B)

A)

B)

A)

B)

C)

A)

B)

A)

B)

1. 770nm
2. 790nm
3. 815nm
4. 840nm
5. 865nm
6. 890nm
7. 920nm
8. 945nm
9. 975nm
10. 1005nm
11. 1035nm
12. 1070nm

US 11,371,883 B2

SEMICONDUCTOR LIGHT SOURCE, OPERATING METHOD AND SPECTROMETER

CROSS-REFERENCE TO RELATED APPLICATIONS

The present application is a national stage entry according to 35 U.S.C. § 371 of PCT application No.: PCT/EP2018/077508 filed on Oct. 9, 2018; which claims priority to German Patent Application Serial No.: 10 2017 123 414.4 filed on Oct. 9, 2017, and claims priority to German Patent Application Serial No. 10 2018 118 079.9 filed on Jul. 26, 2018; all of which are incorporated herein by reference in their entirety and for all purposes.

TECHNICAL FIELD

A semiconductor light source is specified. Furthermore, an operating method and a spectrometer are specified.

BACKGROUND

One object to be achieved resides in specifying a semiconductor light source for a spectrometer which is producible in a cost-effective manner.

SUMMARY

This object is achieved inter alia by means of a semiconductor light source, by means of an operating method and by means of a spectrometer having the features of the independent patent claims.

In accordance with at least one embodiment, the semiconductor light source is provided for a spectrometer. That is to say that, in use as intended, the semiconductor light source is situated as a light source, in particular as the sole light source, in a spectrometer. A radiation intensity of radiation of the semiconductor light source that is reflected at an object or is transmitted through an object is measurable by the spectrometer in a wavelength-dependent manner.

In accordance with at least one embodiment, the semiconductor light source comprises one or more multipixel chips. The at least one multipixel chip comprises a plurality of mutually independently drivable emission regions. In this case, each emission region is configured for generating radiation. The pixilation of the chip is achieved in particular by means of a structuring of electrodes and/or of a semiconductor layer sequence of the multipixel chip. In particular, all the emission regions of the multipixel chip are produced from the same semiconductor layer sequence or partly or completely comprise the same semiconductor layer sequence and can be configured for generating radiation having the same spectral properties. Alternatively, the multipixel chip comprises a plurality of emission regions for different wavelengths, for example not only for blue light, but additionally also for red and/or hyper-red light, for instance.

By way of example, the semiconductor layer sequence is fashioned as described in the document US 2015/0014716 A1. The disclosure content of said document is incorporated by reference, in particular with regard to paragraphs 41 to 45, 66 and 67 of said document.

The semiconductor layer sequence is based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or else an arsenide compound semiconductor material such as $Al_nIn_{1-n-m}Ga_mAs$ or such as $Al_nGa_mIn_{1-n-m}As_kP_{1-k}$, wherein in each case $0 \leq n \leq 1$, $0 \leq m \leq 1$ and $n+m \leq 1$ and $0 \leq k < 1$. In a non-limiting embodiment, $0 < n \leq 0.8$, $0.4 \leq m < 1$ and $n+m \leq 0.95$ and $0 < k \leq 0.5$ hold true here for at least one layer or for all the layers of the semiconductor layer sequence. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances.

In accordance with at least one embodiment, the semiconductor light source comprises one or more color setting means. The at least one color setting means is disposed optically downstream of some or all of the emission regions, in particular is disposed directly optically downstream thereof, such that then no further optical component is applied between the color setting means and the associated emission region. The color setting means is furthermore configured for altering a spectral emission behavior of the assigned emission regions. In other words, a spectrum, as generated in the emission regions of the multipixel chip, is altered by the color setting means, for example by wavelength conversion and/or spectral filtering, that is to say by addition and/or removal or attenuation of spectral components of the radiation emitted by the emission regions.

In accordance with at least one embodiment, the semiconductor light source comprises a drive unit. The drive unit is configured to operate the emission regions independently of one another and temporally successively. In other words, the emission regions can be temporally sequentially switched on, such that each emission region emits radiation only for a short period of time. In a non-limiting embodiment, no two emission regions which are assigned to different spectral emission behaviors are operated simultaneously.

For the purpose of improved heat dissipation, it is possible for emission regions that are situated spatially directly next to one another not to be driven directly successively in time, but rather in a hopping manner. In the case of the square multipixel chip, for example, driving of the emission regions could hop for instance from the bottom left to the top right, then for example into the remaining corners and subsequently across a central region.

In accordance with at least one embodiment, during operation many spectrally narrowband individual spectra are emitted successively by the emission regions together with the respectively associated color setting means. A total spectrum emitted by the semiconductor light source is constituted from the individual spectra. In particular, the total spectrum is a continuous spectrum having no or no significant spectral gaps. Alternatively, the total spectrum can also have spectral gaps.

Narrowband means for example that spectral widths of the individual spectra are in each case at most 20% or 10% or 5% of a spectral width of the total spectrum.

In this case, the individual spectra do not overlap or do not overlap significantly, for example to the extent of at most 20% or 10% of a spectral width, relative to a full width at half maximum, also referred to as FWHM.

In at least one embodiment, the semiconductor light source is provided for a spectrometer and comprises at least one multipixel chip comprising a plurality of mutually independently drivable emission regions. At least one color setting means is disposed optically downstream of at least some of the emission regions or is integrated into the emission regions and is configured for altering a spectral emission behavior of the assigned emission regions. A drive unit is configured to operate the emission regions successively, such that during operation many spectrally narrow-band individual spectra are emitted successively by the emission regions together with the associated color setting means, from which individual spectra a total spectrum emitted by the semiconductor light source is constituted. The color setting means is in particular a laser resonator, a color filter, a phosphor or a combination thereof.

Optical spectrometers are generally laboratory devices. Such spectrometers are usually technically complex, large and expensive. In particular, the costs of such spectrometers are a few thousand euros.

With spectrometers which operate in the near infrared range, as may be the case for the spectrometer described here, materials such as foodstuffs, liquids, plants, medicaments, substances, textiles, inks, prints and the like can be analyzed and/or identified and/or automatically monitored. In this case, vis-à-vis laboratory devices, more cost-effective and significantly smaller spectrometers are necessary for portable devices and end consumer products such as smartphones or portable computers. This is achievable with the semiconductor light source described here.

In conventional, already comparatively miniaturized spectrometers, only a relatively low spectral resolution is provided. Furthermore, a sensor sensitivity is greatly reduced in particular in the spectral range above 1.1 μm on account of the reduced silicon sensitivity of the silicon detectors usually used. In the case of such spectrometers, moreover, a spectral selection is normally effected on the detector side, for example by means of a spectral splitting or by means of an array of filters, or by means of movable components. Especially in the case of portable devices such as smartphones, movable components should be viewed in a critical light, however, since such components are generally sensitive to vibrations.

The silicon-based CMOS image sensors used in spectrometers are generally pixelated and usually have a plurality of megapixels and are therefore comparatively expensive. Moreover, owing to the spectral properties of silicon, these sensors are sensitive only up to wavelengths of approximately 1.1 μm. For many substances this corresponds to the third molecular harmonic, that is to say that only an indirect measurement of molecular spectra can take place. Other substances, such as some plants, for example, do not yield a sufficient and/or a significant signal in the spectral range below 1.1 μm.

In the case of the semiconductor light source described here, a spectral resolution is effected on the light source side rather than first on the detection side. This makes it possible to use single-channel photodiodes as a detector. As a result, cost-effective photodiodes based on InGaAs or germanium, for instance, can be used, without the costs of the overall system being significantly increased. In this regard, it is possible to use just small detector areas, for instance of at least 0.1 mm 0.1 mm and/or of at most 1 mm 1 mm or 0.5 mm 0.5 mm. By way of example, the area costs of an InGaAs photodiode per mm$^2$ are approximately a factor of 100 higher than for silicon. With the use of other, more expensive materials for the photodiode and at the same time smaller detection areas, the spectral range of interest above 1.1 μm is accessible in a cost-effective manner.

In order to realize the cost-effective spectrometer described here with high spectral resolution and with a small structural size, use is made of a spectrally tunable pixelated LED chip as a light source with a simply constructed, single-channel photodiode as a detector. The generation of the spectral resolution thus shifts from the detector to the light source. The object to be analyzed is illuminated or transilluminated in turn with spectrally narrow pulses and an intensity of the reflected or transmitted light is detected by the simple, small and thus cost-effective photodiode. Thus, on the detector side, there is no need for complex spectral filtering or spectral decomposition. Furthermore, on the detector side, there is no need for complex intelligence based on integrated circuits; an intensity measurement is sufficient. As a result, the costs of the detector are able to be greatly reduced.

Overall, with the semiconductor light source described here and with the spectrometer described here, a further miniaturization of the detector is achievable; the area requirement is greatly reduced specifically vis-à-vis a detector having a multiplicity of spectral filters. On account of the reduction of the complexity on the detector side, a reduction of costs is achievable. In particular, relative to their area costs, expensive material systems such as InGaAs are usable, without the system costs being significantly influenced. As a result, wavelength ranges in particular above 1.1 μm are addressable and this opens up more accurate analyses for example in the field of foodstuffs, medicaments or substance analyses in the chemical field.

If color filters are used, then ideally the spectrum emitted by the multipixel chip and/or the phosphor for this purpose is as wide as the spectral passband of the color filter.

In accordance with at least one embodiment, for the or at least one of the multipixel chips, a phosphor layer extending continuously over the emission regions of said multipixel chip is present. The phosphor layer is configured for absorbing the radiation generated by the multipixel chip and converts said radiation into a radiation of a different, longer, wavelength. In particular, the phosphor layer is configured for the full conversion of the radiation of the multipixel chip. The phosphor layer can extend over the multipixel chip without any gaps.

Alternatively, it is possible for the phosphor layer to be configured in island-shaped or strip-shaped fashion and to be applied to individual emission regions in island-like or strip-like fashion. An optical isolation, in particular composed of a material that is nontransmissive to the radiation generated, can be applied between adjacent islands or strips.

In accordance with at least one embodiment, a plurality of color filters are disposed downstream of the phosphor layer. In particular, one of the color filters is disposed downstream of each of the emission regions. The color filters are transmissive in each case only for part of the spectrum generated by the phosphor layer. The individual spectra are thus defined by the color filters. In this case, for the relevant multipixel chip, the color setting means is constituted from the phosphor layer and from the color filters.

It is possible for a plurality of color filters to be arranged in a manner stacked one above another. By way of example, a plurality of smaller color filters bear on a larger color filter extending across their plurality of emission regions, such that cascade-like filtering is possible. In this case, different types of filters can be combined with one another, for example Fabry-Perot filters and filter substances which have a filtering effect on account of their absorption spectrum.

In accordance with at least one embodiment, a respective phosphor layer is disposed downstream of the individual emission regions of the multipixel chip or the emission regions of at least one of the multipixel chips. In particular, there is a unique or a one-to-one assignment between the emission regions and the phosphor layers. Each of the emission regions can be provided with a different phosphor layer.

The individual spectra are defined by way of the phosphor layers. That is to say that the phosphors, which are arranged next to one another in particular as seen in plan view, are phosphors exhibiting spectrally narrowband emission. In this case, the color setting means of the relevant multipixel chip(s) is constituted from the phosphor layers assigned to the emission regions.

By way of example, a phosphor or a phosphor mixture of the phosphor layer comprises at least one of the following substances: rather-earth-doped gallogermanates such as $La_3Ga_5GeO_{14}:Cr$; $Eu^{2+}$-doped nitrides such as $(Ca,Sr)AlSiN_3:Eu^{2+}$, $Sr(Ca,Sr)Si_2Al_2N_6:Eu^{2+}$, $(Sr, Ca)AlSiN_3*Si_2N_2O:Eu^{2+}$, $(Ca, Ba, Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}:RE$ where X=halide, N or divalent element, D=trivalent or tetravalent element and Re=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$ where RE=rare earth metals; nitride-orthosilicates such as $AE_{2-x-a}RE_xEu_aSiO_{4-x}N_x$ or $AE_{2-x-a}RE_x\text{-}Eu_aSi_{1-y}O_{4-x-2y}N_x$ where RE=rare earth metal and AE=alkaline earth metal, or such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM phosphors from the $BaO-MgO-Al_2O_3$ system such as $BaMgAl_{10}O_{17}:Eu^{2+}$; halophosphates such as $M_5(PO_4)_3(Cl,F):(Eu^{2+},Sb^{2+},Mn^{2+})$; SCAP phosphors such as $(Sr,Ba,Ca)_5(PO_4)_3Cl:Eu^{2+}$. The phosphors specified in the document EP 2 549 330 A1 are also usable as phosphors. With regard to the phosphors used, the disclosure content of said document is incorporated by reference. Moreover, so-called quantum dots can also be introduced as converter material. Quantum dots in the form of nanocrystalline materials comprising a group II-VI compound and/or a group III-V compound and/or a group IV-VI compound and/or metal nanocrystals are here.

In accordance with at least one embodiment, the emission regions of at least one of the multipixel chips or of the multipixel chip are combined to form a plurality of groups. That is to say that each group comprises a plurality of emission regions.

In accordance with at least one embodiment, a continuous phosphor layer is disposed downstream of at least one of the groups or downstream of some of the groups or downstream of each of the groups.

Alternatively, the phosphor layer can be applied to the emission regions of the group in island-shaped fashion. The optical properties of the phosphor layer do not vary within a group. That is to say that each of the groups comprises the same phosphor mixture, for example. In a non-limiting embodiment, a plurality of groups are present, each of which is assigned one of the phosphor layers. The phosphor layers are arranged next to one another across the relevant multipixel chip and do not overlap one another in plan view. It is possible for the relevant multipixel chip to be covered by the phosphor layers overall completely or almost completely.

In accordance with at least one embodiment, in each case the color filters succeed the phosphor layers in the individual emission regions of the groups. That is to say that the color filters can be assigned, assigned one-to-one to the individual groups and/or to the individual emission regions. In this case, transmission spectra of the color filters are spectrally narrowband, such that the color filters define the individual spectra. That is to say that the color filters cut out a respective part of the emission spectrum of the phosphor layer and this part forms the relevant individual spectrum. Consequently, the color setting means of the relevant multipixel chip is constituted from the phosphor layers and from the color filters.

In accordance with at least one embodiment, at least some of the multipixel chips are configured for emission in different wavelength ranges, in particular in wavelength ranges that differ from one another in pairs. The wavelength ranges can all lie in the near infrared spectral range, wherein the near infrared spectral range extends in particular from 750 nm to 1.4 μm, and/or in the short-wave infrared range, also referred to as SWIR, which extends in particular from 1.4 μm to 3 μm. Alternatively, the different wavelength ranges can be spread over larger spectral ranges and extend for example from the near ultraviolet range to the infrared range.

In accordance with at least one embodiment, in each case one or more color filters are disposed downstream of the emission regions of the multipixel chips, which emit in different wavelength ranges. In this case, the color filters define the individual spectra. That is to say that the total spectrum can correspond to the emission spectra of the multipixel chip(s) and is divided into the individual spectra by the color filters. In this configuration, the color setting means of the relevant multipixel chips is constituted from the color filters. No phosphors are required; the semiconductor light source can be free of phosphors for wavelength conversion.

In accordance with at least one embodiment, at least some of the multipixel chips are configured for emission in different wavelength ranges. A plurality of phosphor layers situated next to one another are disposed downstream of the emission regions of said multipixel chips and one of the color filters or a plurality of the color filters is/are assigned to each of the phosphor layers emission region by emission region. The color filters thus define the individual spectra out of the emission spectra of the phosphor layers, such that the color filters have comparatively spectrally narrowband transmission windows. There can be a one-to-one assignment between the phosphor layers and the multipixel chips. In this configuration, the color setting means of the relevant multipixel chips is formed from the phosphor layers together with the color filters.

In accordance with at least one embodiment, the spectral width of the individual spectra is at least 2 nm or 4 nm. Alternatively or additionally, said spectral width is at most 30 nm or 12 nm or 10 nm or 8 nm or 5 nm. Said spectral width corresponds to a spectral width of an emission of the phosphor layers and/or a spectral width of a transmission window of the color filters, in particular as full width at half maximum, FWHM for short. Alternatively or additionally, the spectral width of the individual spectra is at most 600 $cm^{-1}$ or 300 cm-1 or 100 $cm^{-1}$ or 50 $cm^{-1}$. Given a wavelength of 600 nm, a spectral width of 300 $cm^{-1}$ corresponds to approximately 10 nm and is thus significantly less than customary spectral full width at half maximum values of light emitting diode chips of approximately 30 nm.

In accordance with at least one embodiment, the total spectrum is constituted from at least three or five or 20 or 40 or 60 of the individual spectra. Alternatively or additionally, the number of individual spectra for the total spectrum is at most 1030 or 520 or 260 or 130 or 70. As a result of the comparatively large number of individual spectra in combination with the small spectral width thereof, a comparatively high spectral resolution is achievable. The spectral resolution that is achievable with the semiconductor light source in the spectrometer is, in particular, in the region of the spectral width of the individual spectra, that is to say a few nm, and can be predefined by the spectral width thereof.

In accordance with at least one embodiment, the or at least one of the multipixel chips is configured for generating near infrared or short-wave infrared radiation. In this case, the total spectrum constituted from the individual spectra extends particularly continuously at least over the spectral range of 910 nm to 1.2 µm or of 650 nm to 1.1 µm inclusive. In a non-limiting embodiment, said spectral range extends from 650 nm to 1.3 µm or to 1.4 µm.

In accordance with at least one embodiment, the semiconductor light source has a thickness of at least 0.1 mm or 0.2 mm or 0.5 mm or 1 mm.

Alternatively or additionally, the thickness of the semiconductor light source is at most 7 mm or 5 mm or 3 mm. Such a thickness, firstly the semiconductor light source is able to be embodied as mechanically self-supporting; secondly a small space requirement is achieved. Such small thicknesses are achieved, for example, by a growth substrate being removed from a semiconductor light source of the multipixel chips and the semiconductor layer sequence being applied directly to the drive unit. In this case, the drive unit is for example a silicon chip, in particular an integrated circuit, IC for short, based on silicon.

In accordance with at least one embodiment, the drive unit is a carrier for the semiconductor layer sequence. That is to say that the drive unit can be the component which mechanically carries and supports the semiconductor light source. By way of example, for this purpose, the drive unit has a thickness of at least 150 µm or 250 µm or 400 µm. Alternatively or additionally, said thickness is at most 1 mm or 0.5 mm. It is possible for the thickness of the drive unit to make up a proportion of a total thickness of the semiconductor light source of at least 30% or 50% or 60% and/or of at most 85% or 70%.

In accordance with at least one embodiment, the semiconductor light source has a basic area of at least 0.3 mm 0.3 mm or 0.5 mm 0.5 mm. Alternatively or additionally, said basic area is at most 5 mm 5 mm or 3 mm 3 mm. By virtue of such a basic area, firstly a high number of emission regions can be realized; secondly the semiconductor light source is constructed compactly.

In accordance with at least one embodiment, the emission regions as seen in plan view have dimensions of at least 10 µm 10 µm or 20 µm 20 µm or 40 µm 40 µm or 0.1 mm 0.1 mm. Alternatively or additionally, said dimensions are at most 0.5 mm 0.5 mm or 0.2 mm 0.2 mm or 0.1 mm 0.1 mm or 50 µm 50 µm or 30 µm 30 µm. That is to say that the emission regions can be made relatively small. A distance between adjacent emission regions is for example at least 1 µm or 2 µm and/or at most 10 µm or 5 µm or 3 µm.

In accordance with at least one embodiment, at least 4 or 16 or 25 or 100 or 256 of the emission regions are present per multipixel chip. Alternatively or additionally, the number of emission regions is at most 10 000 or 1000 or 256 or 64.

In accordance with at least one embodiment, the drive unit is configured to drive each of the emission regions for at least 50 µs or 0.5 ms or 5 ms and/or for at most 1 s or 0.1 s or 30 ms for emission purposes. A high sensitivity and at the same time a rapid recording of the spectra are possible as a result. Between successive on periods, it is possible to provide in each case off periods for a dark measurement for suppressing ambient light.

In accordance with at least one embodiment, a multipixel chip is configured for generating near ultraviolet radiation and/or blue light and/or green light. Near ultraviolet radiation refers in particular to the spectral range of 300 nm to 400 nm or of 360 nm to 400 nm. Blue light denotes in particular wavelengths of 400 nm to 480 nm. Green light denotes in particular wavelengths of 480 nm to 560 nm. If a blue-emitting multipixel chip is present, then the semiconductor light source comprises a plurality of multipixel chips, in particular additionally a multipixel chip that emits in the red, hyper-red, near infrared and/or in the short-wave infrared spectral range. Red light denotes in particular wavelengths of 590 nm to 650 nm and hyper-red light wavelengths of 650 nm to 750 nm.

In accordance with at least one embodiment, the multipixel chip comprises a plurality of vertically emitting laser units. Such laser units are also referred to as VCSEL. It is possible for the multipixel chip to be a VCSEL chip. The individual laser units or groups of laser units having an identical emission wavelength are electrically drivable independently of one another, but alternatively can also all be operated jointly. The individual laser units or groups of laser units are configured for emitting radiation of different wavelengths of maximum intensity.

If the laser units or the groups of laser units having an identical emission wavelength are not drivable independently of one another, then filtering or splitting of the wavelengths can be carried out on the detector side, for example by means of a spectrometer or by means of the color filters.

In accordance with at least one embodiment, the semiconductor light source comprises a plurality of color filters disposed optically downstream of the vertically emitting laser units as color setting means. Said color filters, of which the color setting means can consist, are tuned respectively to the different wavelengths of maximum intensity. That is to say, in particular, that the wavelengths of maximum intensity with a tolerance of at most 20 nm or 10 nm or 5 nm or 1 nm are in each case equal to a central wavelength of a spectral passband of the associated color filter.

As an alternative or in addition to such color filters that are assigned to the laser units, it is likewise possible for the color setting means to be integrated in the laser units. This can mean that the resonators and/or the active laser media of the laser units or of the groups of laser units are fashioned such that only the spectrally narrowband individual spectra are emitted from the laser units.

Separate color filters can be omitted in this case. The color setting means is thus formed by the resonators and/or by the active laser media.

In accordance with at least one embodiment, no phosphor is assigned to the laser units. It is possible for the semiconductor light source to be entirely free of phosphors. Consequently, predominantly or only radiation which can pass through the optional color filters on the detector side and/or fitted in front of the semiconductor light source is generated. Light conversion can thus be completely dispensed with, which results in a significantly increased efficiency by virtue of avoiding the Stokes shift and the relatively low quantum efficiency of available converter materials.

Alternatively or additionally, multipixel chips that emit different-colored light, such as green light or yellow light or orange light or red light, can be present. By way of example, the total spectrum of the semiconductor light source in this configuration extends continuously over the spectral range of 450 nm to 580 nm and/or of 590 nm to 730 nm inclusive, that is to say red and hyper-red. In this case, it is possible for a phosphor to be present which converts the light generated directly by the multipixel chip partly or completely into different-colored light, such as yellow light and/or green light, which can then be filtered.

In at least one embodiment, the semiconductor light source is provided for a portable device and comprises a plurality of light emitting diode chips having a plurality of mutually independently drivable emission regions. At least one color setting means is disposed optically downstream of at least some of the emission regions and is configured for altering a spectral emission behavior of the assigned emission regions. A drive unit is configured to operate the emission regions successively, such that during operation many spectrally narrowband individual spectra are emitted successively by the emission regions together with the associated color setting means, from which individual spectra a total spectrum emitted by the semiconductor light source is constituted. The features presented above in association with the at least one multipixel chip are correspondingly applicable to the use of a plurality of light emitting diode chips comprising in each case only exactly one emission region or in each case only a small number of emission regions, for example at most four or nine or 16 emission regions. Multipixel chips can likewise be used in combination with such light emitting diode chips in a semiconductor light source.

Furthermore, the spectrometer is specified. The spectrometer comprises at least one semiconductor light source as described in connection with one or more of the embodiments mentioned above. Features of the spectrometer are therefore also disclosed for the semiconductor light source, and vice versa.

In at least one embodiment, the spectrometer comprises at least one semiconductor light source and also one or more detector chips. The at least one detector chip is configured for sequentially detecting radiation of the individual spectra. In this case, at least part of the radiation provided for detection is in the near infrared and/or in the short-wave infrared spectral range. A spectral resolution which is achievable with the detector chip together with the semiconductor light source is 30 nm or less or 25 nm or less or 18 nm or less or 12 nm or less or 8 nm or less or 6 nm or less. Alternatively or additionally, the spectral resolution is 600 cm$^{-1}$ or less or 300 cm$^{-1}$ or less or 100 cm$^{-1}$ or less or 50 cm$^{-1}$ or less.

In accordance with at least one embodiment, the detector chip is a photodiode, in particular a single-channel photodiode. It is possible for a plurality of single-channel photodiodes, for instance optimized for different spectral ranges, to be present in a manner combined with one another in the spectrometer. In a non-limiting embodiment, however, exactly one single-channel photodiode is present, which constitutes the sole detector chip of the spectrometer.

In accordance with at least one embodiment, an array of laser units exhibiting spectrally narrowband emission, in particular VCSELs, serves as a light source for the spectrometer. An emission of the individual laser units is spectrally narrowband in such a way that neither separate color filters nor phosphors are present on the part of the semiconductor light source. The color setting means is then formed in particular by the resonators of the laser units.

If the laser units exhibit spectrally narrowband emission, then color filters can be present on the detector side. The detector chip then has multiple channels or a plurality of different detector chips are present, which are sensitive in different wavelength ranges on account of the color filters. In this case, it is possible for the laser units all to emit simultaneously. If the laser units emit the respective radiation temporally successively, then only one single-channel detector chip need be present and color filters for spectrally splitting the radiation of the laser units can be completely omitted. If color filters are present, then their transmission curves are adapted to the emission spectra of the laser units.

In accordance with at least one embodiment, the photodiode or one of the photodiodes is based on the material system AlInGaAs. In particular, the photodiode is configured for detecting radiation up to at least 1.3 µm or 1.5 µm or 1.7 µm.

In accordance with at least one embodiment, the spectrometer has a mass of at least 2 g or 5 g. Alternatively or additionally, the mass of the spectrometer is at most 20 g or 10 g. This low weight is achieved in particular by the use of the multipixel chips and by movable components being dispensed with.

In accordance with at least one embodiment, the spectrometer, in particular with regard to the optically effective components, consists only of components that are stationary relative to one another. That is to say that the spectrometer is free of movable optical components. In this context, optical components are in particular radiation sources, detectors, optical elements such as lenses or mirrors and wavelength-resolving elements such as prisms or gratings. That is to say that the spectrometer then comprises in particular no Fabry-Perot elements having movable mirrors and/or no MEMS components.

In accordance with at least one embodiment, the spectrometer is fashioned as a reflection spectrometer. That is to say that with the spectrometer an object is illuminated and the light reflected diffusively for instance at the object is detected by the detector chip. Alternatively, the spectrometer can be fashioned as a transmission spectrometer, such that the light to be detected is guided through the object. In the last-mentioned case, the semiconductor light source and the detector chip can be accommodated spatially separately from one another and need not necessarily be situated in a common component housing of a device such as smartphone, but rather can be divided between a plurality of component houses or between a plurality of interconnected devices.

It is possible for one or more background measurements to be performed before or during the measurement of the spectra, this also being referred to as a lock-in method.

In accordance with at least one embodiment, the spectrometer comprises evaluation electronics. Alternatively, the evaluation electronics can be accommodated in a device into which the spectrometer is incorporated. The evaluation electronics can contain a storage unit having spectral data of various objects which are configured for comparison with measurement data.

In accordance with at least one embodiment, the spectrometer and/or the evaluation electronics is/are configured to identify the freshness of a foodstuff such as fruit on account of a reflection of the generated radiation at said foodstuff, for example on the basis of a moisture content or on the basis of a sugar content.

Alternatively or additionally, it is possible for the spectrometer and/or the evaluation electronics to be configured to identify a reflection of radiation at skin, in particular human skin, and thus to identify a coloration, for example on account of makeup, or to deduce specific diseases. That is to say that the spectrometer can be used in medicine for diagnosis purposes.

Alternatively or additionally, it is possible for the spectrometer and/or the evaluation electronics to be configured to analyze a reflection at a chemical, a drug or a medicament. By way of example, it is thus possible to determine a material composition, for example a moisture content or a degree of oxidation or a degree of corrosion. It is likewise possible thus to deduce a shelf life of a medicament, for instance, and to assess whether said medicament can still be used.

It is likewise possible that body fluids such as blood can be subjected to a high-speed test.

Alternatively or additionally, it is possible for the spectrometer and/or the evaluation electronics to be configured to identify a mechanical material constitution, for example a degree of weathering of building materials such as wood or plastics. It is possible to deduce a mechanical strength of the relevant materials, for example, on the basis of the spectral properties.

Alternatively or additionally, the spectrometer and/or the evaluation electronics is/are configured for one or more of the following applications:
  determining a water content of skin and/or tissue, for example for the recommendation of products in the cosmetics industry,
  identifying counterfeit drugs,
  identifying fake and/or adulterated milk powder,
  identifying paint thickness for instance in the case of automobiles,
  identifying the material composition of textiles, for example for a washing recommendation, and/or
  determining a calorie content, water content, fat content and/or carbohydrate content in foodstuffs,
  automatic monitoring of foodstuffs, plants and/or chemicals and drugs.

In accordance with at least one embodiment, the spectrometer is provided for incorporation into a portable device. The portable device is a smartphone, for example. For this purpose, the spectrometer comprises electrical contact points and/or interfaces which make possible, in particular, electrical connection to a computing unit and/or an energy source of the device into which the spectrometer is installed.

Furthermore, a method for operating the semiconductor light source and/or the spectrometer is specified. The method is used to operate a spectrometer and/or a semiconductor light source as described in connection with one or more of the embodiments mentioned above. Features of the spectrometer and of the semiconductor light source are therefore also disclosed for the method, and vice versa.

In at least one embodiment of the method, the emission regions are driven by means of the drive unit such that the emission regions emit the individual spectra temporally successively, such that the total spectrum is generated on average over time. A radiation of the semiconductor light source that is reflected at an object or is transmitted through an object is detected by the detector chip, such that the spectral properties of the object are measured. Further properties of the object can be deduced on the basis of the spectral properties.

Furthermore, a portable device, in particular a smartphone, is specified. The portable device comprises at least one spectrometer as disclosed in connection with one or more of the embodiments mentioned above. Features of the spectrometer are therefore also disclosed for the portable device, and vice versa.

A semiconductor light source described here and a spectrometer described here are explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

BRIEF DESCRIPTION OF THE DRAWINGS

Further advantages and refinements of the various embodiments may be explained below in connection with the figures, in which.

Elements which are the same or of the same type, or which have the same effect, are provided with the same references in the figures. The figures are respectively schematic representations and therefore not necessarily true to scale. Rather, relatively small elements, and in particular layer thicknesses, may be represented exaggeratedly large for illustration.

DETAILED DESCRIPTION

Figure 1:
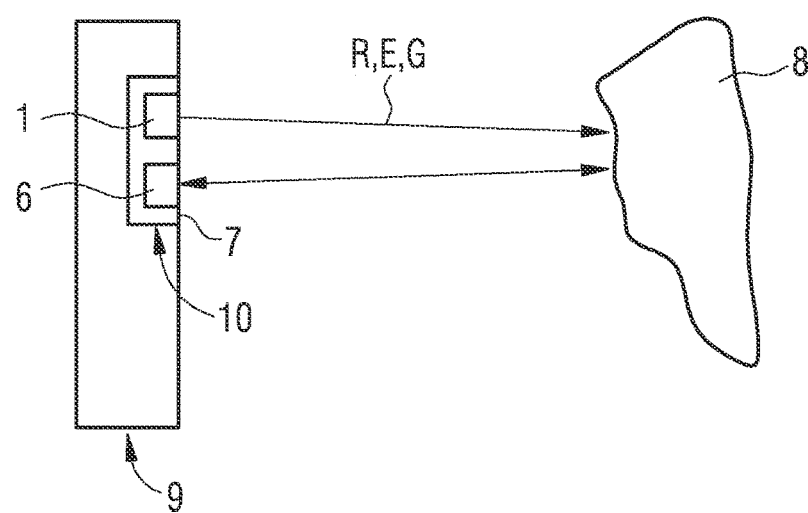
FIG. 1 shows a schematic sectional illustration of one exemplary embodiment of a spectrometer described here in a smartphone.

FIG. 1 schematically shows one exemplary embodiment of a spectrometer 10. The spectrometer 10 is an integral part of a portable device 9, which is a smartphone, for example.

The spectrometer 10 comprises a semiconductor light source 1 for emitting a radiation R. Furthermore, the spectrometer 10 comprises one or more detector chips 6 and also evaluation electronics 7. Optical components such as lenses are not depicted separately in order to simplify the illustration.

The radiation R generated by the semiconductor light source 1 is reflected diffusively or else spectrally at a reflection object 8, for example a foodstuff, medicaments or human skin. Part of the reflected light, having been altered spectrally on account of spectrally different absorption, passes to the detector chip 6 and is detected there. In this case, the detector chip 6 has a single channel and splitting of a total spectrum G into spectrally narrowband individual spectra E takes place on the part semiconductor light source 1. By way of the evaluation electronics 7, it is possible to ascertain for example whether the reflection object 8 is ripe and/or fresh fruit and/or vegetables.

Figure 2:
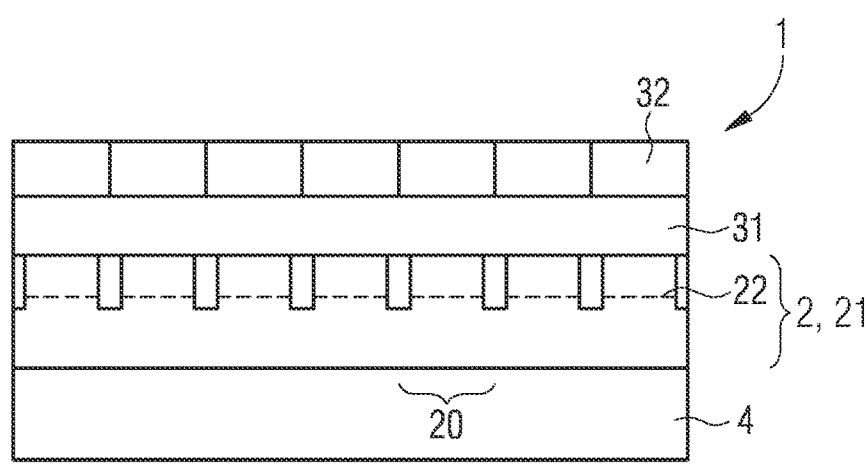
FIGS. 2A, 3A, 4A, 5A and 6A show schematic sectional illustrations of exemplary embodiments of semiconductor light sources described here.
FIGS. 2B, 3B, 4B, 5B and 6B show schematic illustrations of spectral properties of exemplary embodiments of semiconductor light sources described here.
Figure 2:
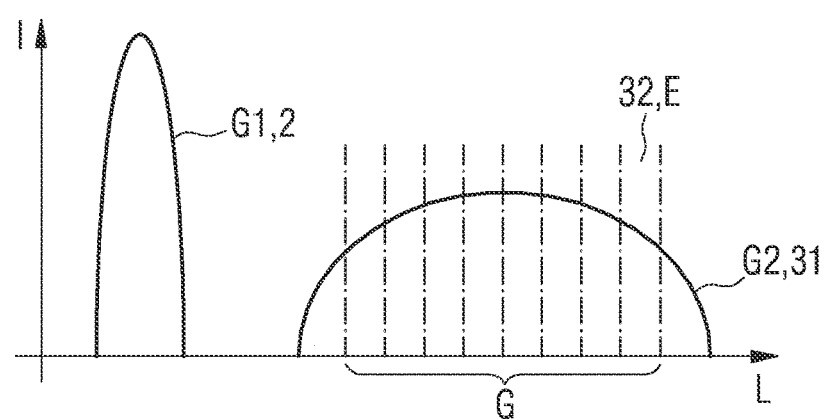

FIG. 2A illustrates one exemplary embodiment of the semiconductor light source 1 in greater detail. The semiconductor light source 1 comprises a drive unit 4, for example a silicon chip comprising integrated circuits. A multipixel chip 2 comprising a semiconductor layer sequence 21 is situated on the drive unit 4. As seen in plan view, the multipixel chip 2 can extend over the entire drive unit 4. It is possible for the drive unit 4 to mechanically carry and support the multipixel chip 2 and thus the semiconductor layer sequence 21 and hence to function as a carrier. The multipixel chip 2 is, in particular, a pixelated light emitting diode chip.

An active zone 22 for generating radiation by means of electroluminescence is situated in the semiconductor layer sequence 21, which extends continuously across the entire multipixel chip 2. The semiconductor layer sequence 21 is structured to form individual emission regions 20, wherein a structuring into the emission regions 20 can extend through the active zone 22. The active zone 22 is thus restricted in island-shaped fashion to the respective emission regions 20. This structuring can also result in an optical isolation between the emission regions 20. For this purpose, the regions from which the semiconductor layer sequence 21 is removed between the emission regions 20 can be provided with a radiation-nontransmissive material, not depicted.

A phosphor layer 31 extends continuously across all the emission regions 20. The phosphor layer 31 is configured for full conversion of radiation generated in the emission regions 20. For this purpose, the semiconductor layer sequence 21 emits red or near infrared light, for example, such that the phosphor layer 31 generates in spectrally broadband fashion near infrared and short-wave infrared radiation.

If full conversion is not effected by the phosphor layer 31, then it is possible for a filter element (not depicted) for filtering out the radiation of the semiconductor layer sequence 21 to be disposed downstream of the phosphor layer 31. Such a filter element can be transmissive in broadband fashion in the spectral range of the radiation generated by the phosphor layer 31 and, consequently, does not need to effect spectral narrowing of the radiation from the phosphor layer 31.

A thickness of the phosphor layer 31 is for example between 10 μm and 150 μm inclusive. The phosphor layer 31 can comprise phosphor particles which are sintered to form a ceramic or which are embedded into a matrix material, such as a silicone or a glass.

The phosphor layer 31 includes a broadband-infrared-generating phosphor, for example a phosphor as described in the document WO 2016/174236 A1. The disclosure content of said document is incorporated by reference, in particular with regard to patent claims 7 and 8 of said document.

Particularly for the spectral range of 600 nm to 1100 nm, the following phosphors, for instance, are appropriate: $Ga_2O_3$, $Na(Ga,Al)_3O_5$, $Mg_4Nb_2O_9$, $Mg_2SiO_4$:Cr, $La_3(Ga_{0.6}Al_{0.4})_5GeO_{14}$, $La_3Ga_5GeO_{14}$. Particularly for the spectral range of 1450 nm to 1550 nm, the following phosphors, for instance, are appropriate: $Gd_3Ga_5O_{12}$:Ni, $Ni^{2+}$-doped $Gd_3Ga_5O_{12}$ (GGG), YAlO:Ni, Ti, LGO:Ni, Ti, GGG:Ni, $Gd_3Ga_5O_{12}$:Ni codoped with $M^{4+}$, $Zr^{4+}$ and/or $Ge^{4+}$, $Gd_3Ga_5O_{12}$:Ni codoped with $Zr^{4+}$, $Ti^{4+}$, $Si^{4+}$ and/or $Ge^{4+}$.

FIG. 2A likewise shows that a plurality of color filters 32 succeed the phosphor layer 31. The color filters 32 are assigned one-to-one to the emission regions 20. Each of the color filters 32 has only a spectrally narrowband transmission in the range of the radiation generated by the phosphor layer 31. This is also illustrated in connection with FIG. 2B. In this case, an intensity I is plotted as a function of a wavelength L in FIG. 2B.

A total spectrum G1 is emitted by the emission regions 20 and thus by the multipixel chip 2. Radiation from the total spectrum G1 does not pass from the semiconductor light source 1. The total spectrum G1 serves for exciting the phosphor layer 31 and can be in the red spectral range. For this purpose, the semiconductor layer sequence 21 is based on the material system AlInGaAs for instance for red or near infrared light or else on AlInGaN0 for instance for blue light.

The spectrum G2 generated by the phosphor layer 31 is decomposed into a multiplicity of individual spectra E by the color filters 32, wherein the sum of the individual spectra E forms the total spectrum G. In a non-limiting embodiment, a spectrally continuous range extending over a large part or over the entirety of the spectrum G2 of the phosphor layer 31 is formed by the individual spectra E.

The individual emission regions 20 are successively driven temporally sequentially, such that the individual spectra E are emitted temporally successively and the total spectrum G forms only on average over time. Thus, the single-channel detector chip 6 can record a spectrum sequentially, on account of the spectral selectivity of the semiconductor light source 1.

The semiconductor light source 1 thus comprises separately addressable pixels in the form of the emission regions 20. The driving is effected by way of the drive unit 4, which is an IC. The phosphor layer 31 is deposited over the whole area, for example as an adhesively bonded lamella, as a full potting or as a layer applied by means of spray coating or by electrophoresis.

Adhesive layers possibly present for the phosphor layer 31 and the color filters 32, which can also be present in all other exemplary embodiments, are not depicted in each case. Such adhesive layers are not crucial for the spectral properties since corresponding adhesives based on silicones, in particular, are transparent in the relevant spectral ranges and have in particular only small layer thicknesses for instance of at most 5 μm.

Figure 8:
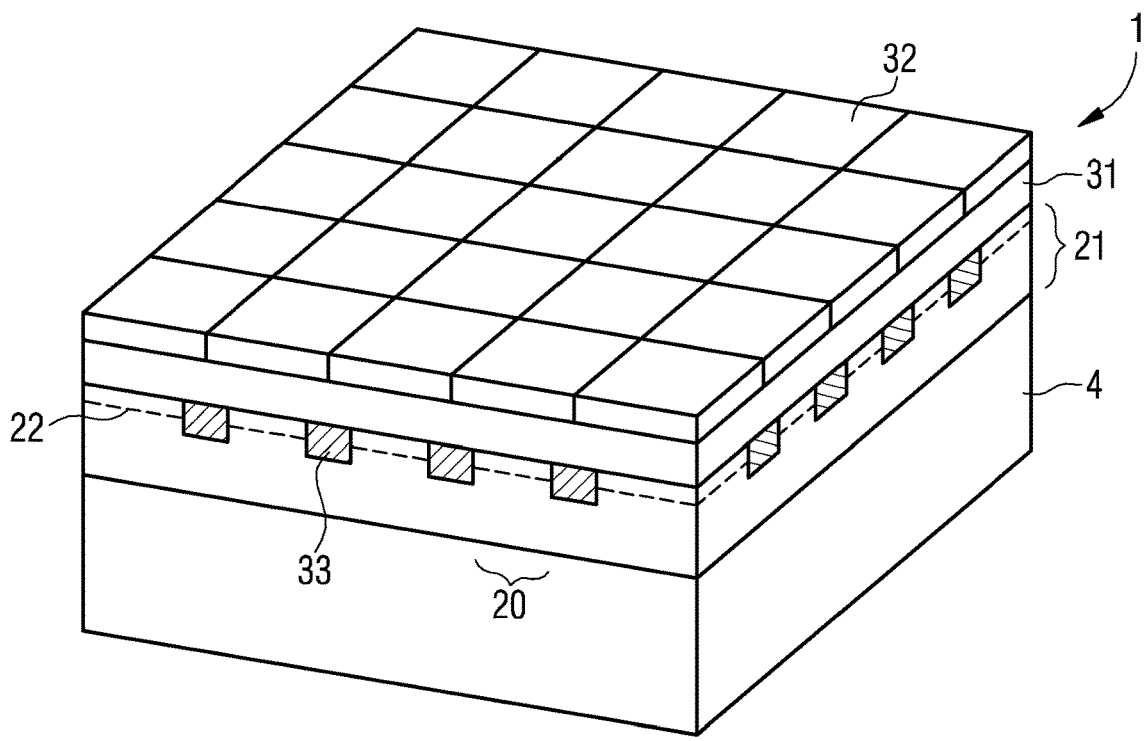
FIG. 8 shows a schematic perspective illustration of one exemplary embodiment of a semiconductor light source described here.

The color filters 32, fashioned as filter lamellae, are for example line filters and can be arranged in a checkered manner, as seen in plan view; see also FIG. 8. FIG. 8 additionally illustrates that an optical isolation 33 is arranged between the emission regions 20.

A lateral size of the color filters 32 corresponds to the size of the individual emission regions 20, for example with a tolerance of at most 20% or 10% or 5% of a lateral extent. The individual color filters 32 can be situated on a continuous, transparent carrier at a side facing away from the phosphor layer 31; see also the explanations concerning FIG. 9 below. The individual color filters 32 are for example in each case Fabry-Perot filters having different optical thicknesses. In particular, the color filters 32 are adhesively bonded onto the phosphor layer 31.

With regard to the color filters 32, simple Fabry-Perot filters are appropriate. The two mirrors of the Fabry-Perot filter can either be composed of metal or be designed as purely dielectric highly reflective mirrors. In the latter case, significantly more layers are necessary and the filter is correspondingly more expensive; in return, a higher transmission is achievable. The reflectivity of the mirrors determines the line width and the thickness of the layer in the center between the mirrors, for example composed of a transparent oxide such as $SiO_2$, determines the center wavelength. The individual color filters 32 could all have the same mirrors and a center layer thickness adapted in each case to the target wavelength.

Figure 3:
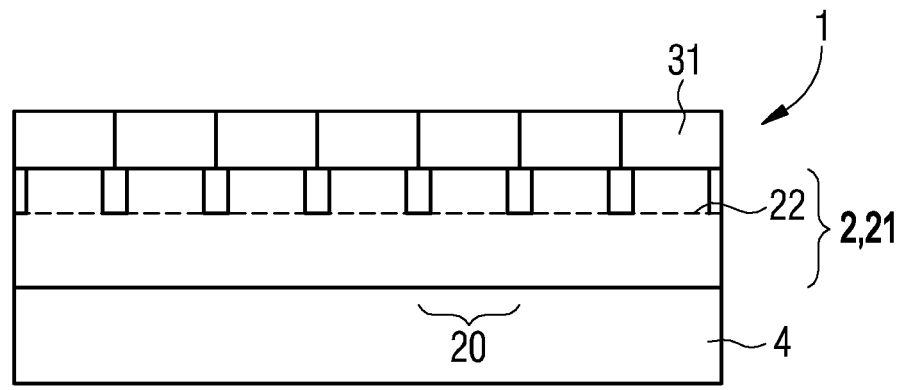
Figure 3:
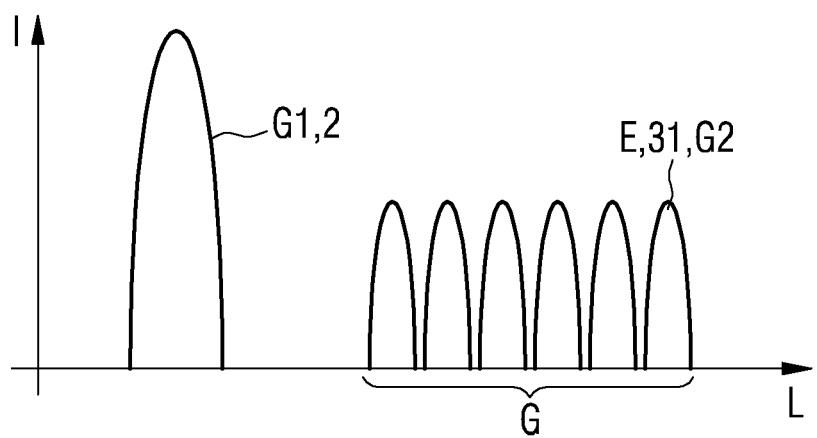

FIG. 3A shows that different phosphor layers 31 are applied to the individual emission regions 20, in a one-to-one assignment. The phosphor layers 31 contain different phosphors and exhibit spectrally narrowband emission in spectral ranges that differ slightly from one another. The wavelength emitted by the semiconductor light source 1 is thus tunable by means of the driving of the individual emission regions 20.

The phosphors 31 used are for example quantum dots, for instance based on PbS or CdS, wherein an exact emission wavelength can be set by an organic shell around the semiconductor cores of the quantum dots.

Such phosphors are described for example in the document Liangfeng Sun et al., Bright infrared quantum-dot light-emitting diodes through inter-dot spacing control, in Nature Nanotechnology, vol. 7, pages 369 to 373, published in 2012, doi:10.1038/nnano.2012.63. Furthermore, such phosphors are described in the document Nobuhiko Ozakil et al., Near-infrared superluminescent diode using stacked self-assembled InAs quantum dots with controlled emission wavelengths, Japanese Journal of Applied Physics, vol. 53, 04EG10, published in 2014, doi:10.7567/JJAP.53.04EG10. The disclosure content of these documents with regard to the quantum dots is incorporated by reference.

Particularly for the spectral range of 600 nm to 1100 nm, the following phosphors, for instance, are appropriate: $Ga_2O_3$, $Na(Ga,Al)_3O_5$, $Mg_4Nb_2O_9$, $Mg_2SiO_4$:Cr, $La_3(Ga_{0.6}Al_{0.4})_5GeO_{14}$, $La_3Ga_5GeO_{14}$. Particularly for the spectral range of 1450 nm to 1550 nm, the following phosphors, for instance, are appropriate: $Gd_3Ga_5O_{12}$:Ni, $Ni^{2+}$-doped $Gd_3Ga_5O_{12}$ (GGG), YAlO:Ni, Ti, LGO: Ni, Ti, GGG:Ni, $Gd_3Ga_5O_{12}$:Ni codoped with $M^{4+}$, $Zr^{4+}$ and/or $Ge^{4+}$, $Gd_3Ga_5O_{12}$:Ni codoped with $Zr^{4+}$, $Ti^{4+}$, $Si^{4+}$ and/or $Ge^{4+}$.

The phosphor layers 31 are applied for example as described in the document WO 2016/034388 A1. The disclosure content of said document is incorporated by reference, in particular with regard to claims 16 and 18 of said document.

Unlike in the illustration in FIG. 2A, the structuring of the semiconductor layer sequence 21 in the exemplary embodiment in FIG. 3A does not extend into the active zone 22. Corresponding configurations of the semiconductor layer sequence 21, as depicted in FIGS. 3A and 2A, can also be used in all other exemplary embodiments in the same way.

FIG. 3B shows that the emitted total spectrum G is constituted from the individual emission spectra G2 of the phosphor layers 31, which simultaneously represent the spectrally narrowband individual spectra E. Portions of the spectrum G1 of the multipixel chip 2 are not emitted from the semiconductor light source 1.

By way of example, the semiconductor layer sequence and the phosphor layers in FIG. 3A are fashioned as described in the document US 2016/0027765 A1. The disclosure content of said document is incorporated by reference, in particular with regard paragraphs 46 to 54 and 68 to 70 of said document.

Alternatively, the semiconductor layer sequence and the phosphor layers in FIG. 3A can be fashioned as described in the document US 2012/0273807 A1. The disclosure content of said document is incorporated by reference, in particular with regard to paragraphs 55 to 60 and 66 to 69 of said document.

Figure 4:
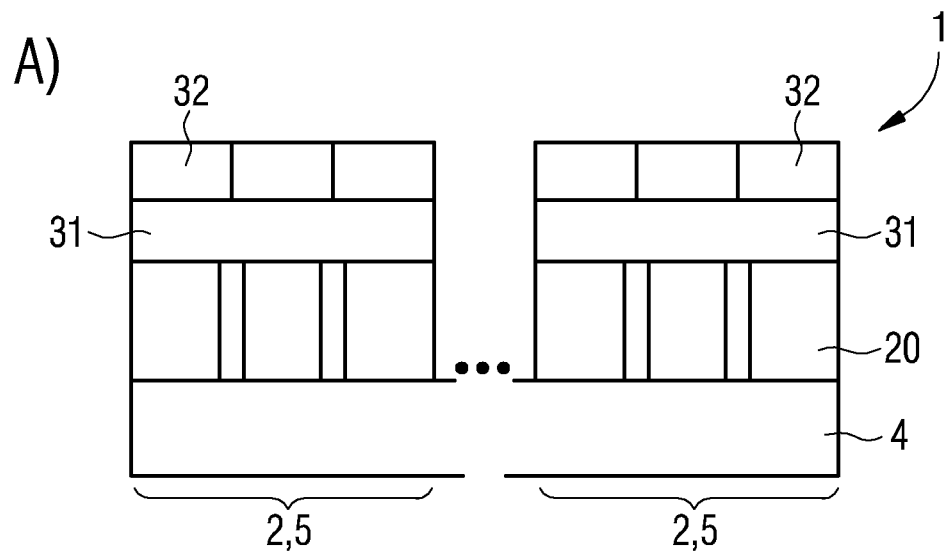
Figure 4:
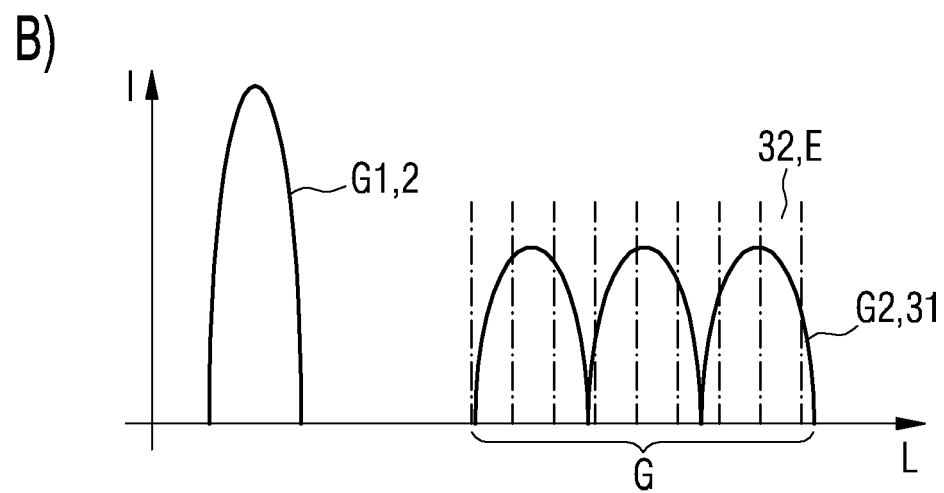

A plurality of multipixel chips 2 are present in the exemplary embodiment in FIG. 4A. The multipixel chips 2 can emit light in the same spectral range and be structurally identical among one another. Alternatively, unlike in the illustration in FIG. 4B, it is also possible for the multipixel chips 2 each to generate radiation in other spectral ranges, for example blue, green and/or red light and also infrared radiation.

A phosphor layer 31 is applied to the multipixel chips 2 over the whole area in each case. The phosphor layers 31 of the multipixel chips 2 here differ from one another and emit in different spectral ranges G2, which can be adjacent to one another and/or overlap. As seen in plan view, the phosphor layers 31 lie next to one another and can partly or else completely cover the drive unit 4. The phosphor layers 31 are for example fashioned as a full potting or applied as lamellae or can be applied on the semiconductor layer sequence 21 by means of spray coating.

In each case a plurality of color filters 32, for example filter lamellae, are subsequently applied to the individual phosphor layers 31. There is a one-to-one assignment between the color filters 32 and the associated emission regions 20. As seen in plan view, the color filters 32, also like the color filters 32 from FIG. 2A or the phosphors 31 from FIG. 3A, are arranged in a checkered manner in a regular array; see also FIG. 8.

The spectral properties of the configuration from FIG. 4A can be seen in FIG. 4B. The spectrum G1 of the multipixel chips 2, structurally identical multipixel chips 2 in accordance with FIG. 4A, is not emitted by the semiconductor light source 1. The difference spectra G2 of the phosphor layers 31 are decomposed into the individual spectra E by the color filters 32, said individual spectra being successively emitted temporally sequentially.

Figure 5:
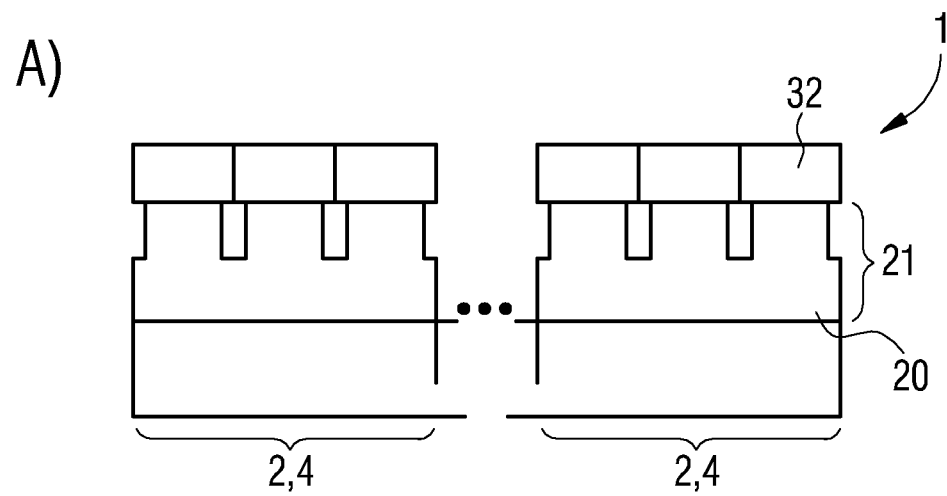
Figure 5:
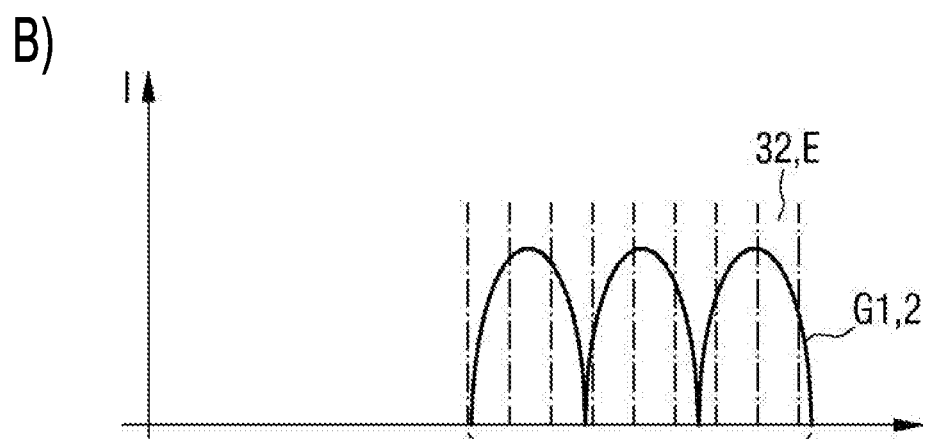

A plurality of multipixel chips 2 are present in the exemplary embodiment in FIG. 5A. In this case, each of the multipixel chips 2 emits radiation in a different spectral range, for example blue, green and/or red light and also infrared radiation, for example near infrared radiation, shortwave infrared and/or mid-infrared, also referred to as MIR. MIR refers in particular to wavelengths of 3 µm to 5 µm or of 3 µm to 8 µm. Appropriate color filters 32 are assigned to the individual emission regions 20.

The total spectrum G is thus constituted, see FIG. 5B, from the individual spectra E of the color filters 32, wherein the spectra G1 of the multipixel chips 2 spectrally adjoin one another.

Figure 6:
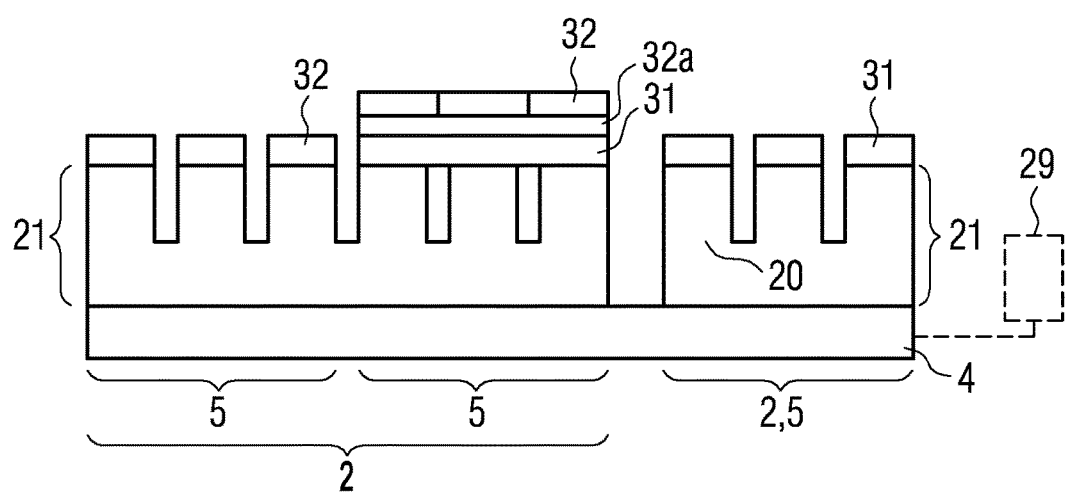
Figure 6:
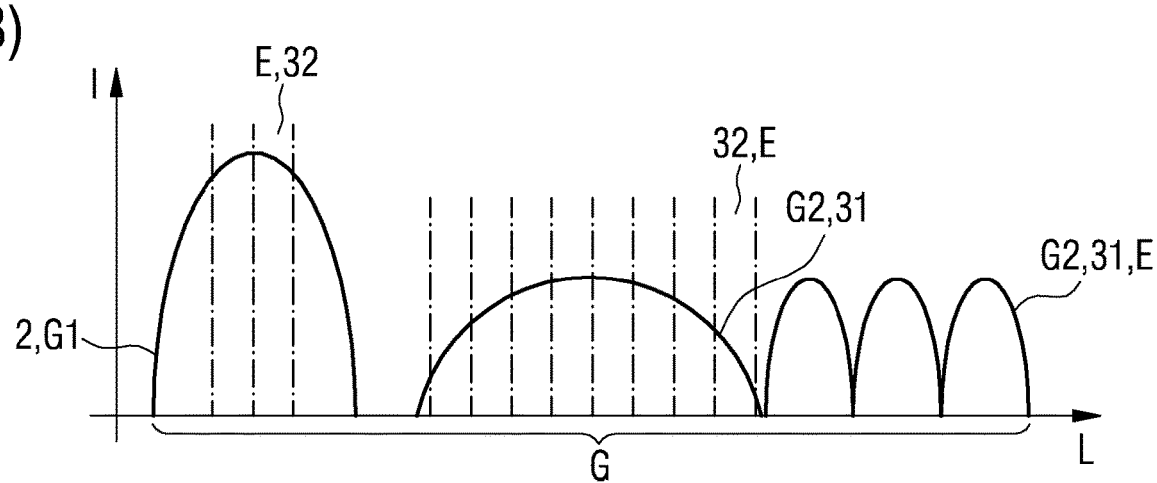

Multipixel chips 2 that emit in different colors are present in the exemplary embodiment in FIG. 6A. In this case, the emission regions 20 can be combined to form groups 5 within the multipixel chips 2, as may also be the case in all other exemplary embodiments. By way of example, a phosphor layer 31 is disposed jointly downstream of all emission regions 20 of one of the groups 5, color filters 32 in turn being disposed downstream of said phosphor layer.

Optionally, the color filters 32 can be applied on a larger filter plate 32a covering a plurality of the emission regions 20. By way of example, the filter plate 32a is a material filter and the color filters 32 are Fabry-Perot filters. By means of such filter grading, sidebands of the Fabry-Perot filters can easily be suppressed.

At the same time, just an array of color filters 32 can be disposed in island-shape fashion downstream of another group 5 of emission regions 20, without phosphor. A further multipixel chip 2 is provided with individual, island-shaped phosphor layers 31, for example. In other words, the embodiments of the semiconductor light source 1 as illustrated in connection with FIGS. 2 to 5 can also be combined with one another.

As also in all other exemplary embodiments, it is possible for one or more unpixellated light emitting diode chips 29 additionally to be present, the latter respectively emitting one of the individual spectra E, depicted by dashed lines in FIG. 6A. Such light emitting diode chips 29 can also be used as an alternative to multipixel chips 2.

Consequently, see FIG. 6B, it is possible to achieve a spectrally wide total spectrum G, firstly as a result of a subdivision of the spectrum G1 of the multipixel chip 2 depicted on the left in FIG. 6A, secondly as a result of the splitting of the radiation G2 of the phosphor 31 and of the phosphor individual spectra G2 of the multipixel chip 2 depicted on the right in FIG. 6A; see also the individual spectra G2 depicted on the right in FIG. 6B. The individual spectrum of the optional light emitting diode chip 29, which individual spectrum could fill the spectral gap between the spectrum G1 and the wide spectrum G2, is not depicted in FIG. 6B.

Figure 7:
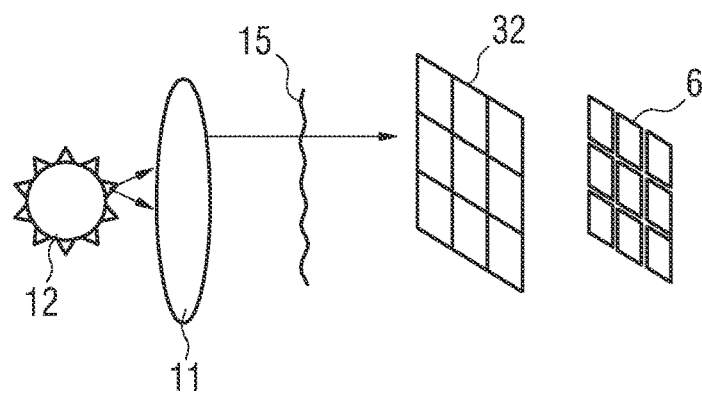
FIGS. 7A, 7B and 7C show schematic illustrations of spectrometers with conventional broadband light sources.
Figure 7:
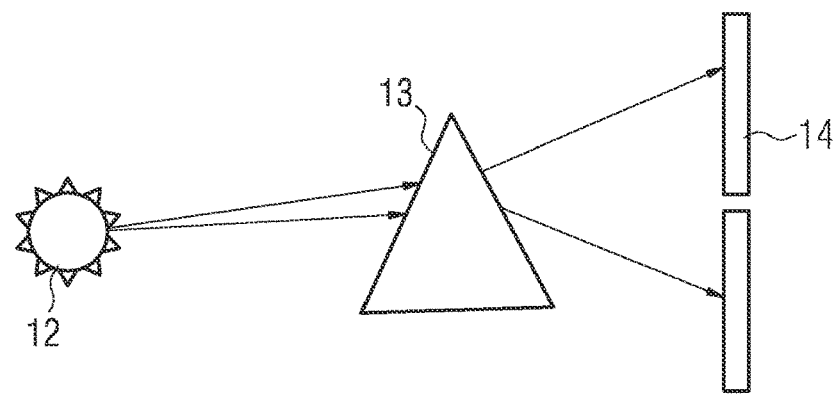
Figure 7:
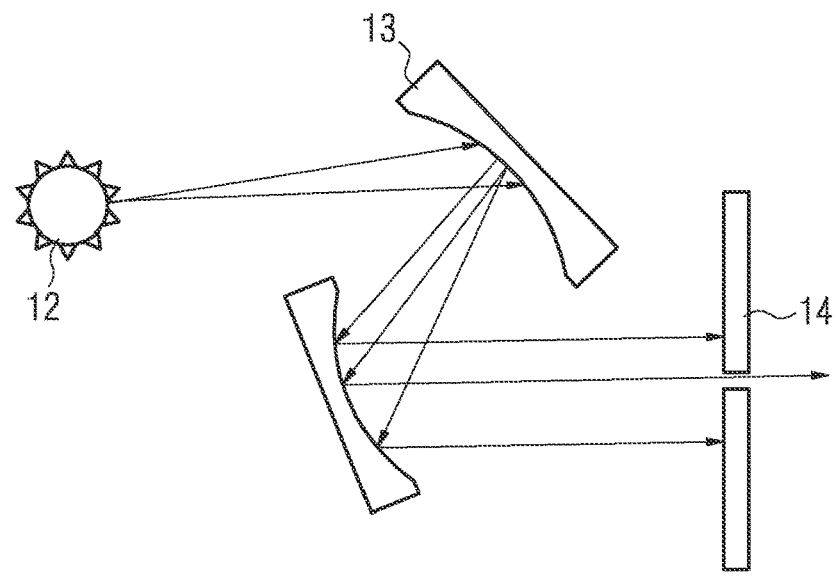

FIG. 7 depicts conventional possibilities for obtaining a spectral resolution. In accordance with the perspective illustration in FIG. 7A, a broadband light source 12 is used, the light of which is collimated by means of a lens 11. Said light passes through a transmission object 15, for example, and is directed onto the pixelated detector chip 6 via color filters 32 arranged in the form of an array. The detector chip 6 is based on silicon and is not suitable for radiation above 1.1 µm. Consequently, in accordance with FIG. 7A, a spectral resolution is effected by the color filters 32 on the part of the detector chip 6.

In the case of the sectional illustration in FIG. 7B, a prism is present as a dispersive optical element 13. A spectral resolution is effected by means of a spatial filter 14, for instance a diaphragm. The spectral resolution is achieved for example by means of a rotation of the prism 13 and/or by means of a movement of the diaphragm 14. By contrast, see FIG. 7C, as a dispersive optical element 13, a grating is provided, in combination with a mirror.

The configurations in FIGS. 7B and 7C require movable components, which, in the case of portable devices with the associated diversions, usually leads to difficulties and additionally increases the complexity of the component. By contrast, in the case of spectrometer 10 described here, a high spectral resolution can be realized cost-effectively with a comparatively simple construction.

Figure 9:
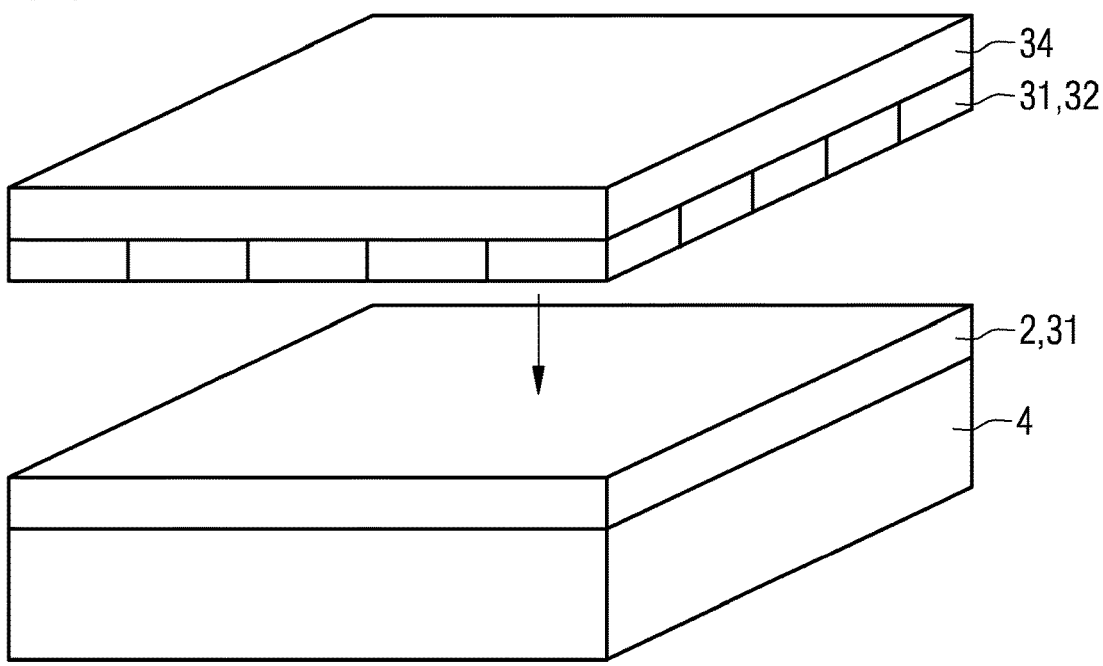
FIG. 9 shows a schematic perspective illustration of a production method for one exemplary embodiment of a semiconductor light source described here.

FIG. 9 schematically shows a production method for a semiconductor light source 1. The phosphor layers 31 and/or color filters 32 to be applied are situated on an intermediate carrier 34. The phosphor layers 31 and/or color filters 32 can be situated on the intermediate carrier 34 in the desired arrangement, such that the phosphor layers 31 and/or color filters 32 are applied jointly to the multipixel chip 2 and/or to a phosphor layer 31 that is optionally already present beforehand. It is then possible for the intermediate carrier 34 to be concomitantly transferred to the multipixel chip 2 and to be part of the finished semiconductor light source 1, for example as a protective layer.

Alternatively, the phosphor layers 31 and/or color filters 32 on the intermediate carrier 34 can all be identical, such that only one of the phosphor layers 31 and/or of the color filters 32 is transferred from the intermediate carrier 34 for instance by means of the laser radiation. A dedicated intermediate carrier 34 can then be present for each of the phosphor layers 31 and/or of the color filters 32.

Such transferring is described for instance in the document US 2013/0292724 A1. The disclosure content of said document is incorporated by reference, in particular with regard to paragraphs 49 to 54 of said document.

Figure 10:
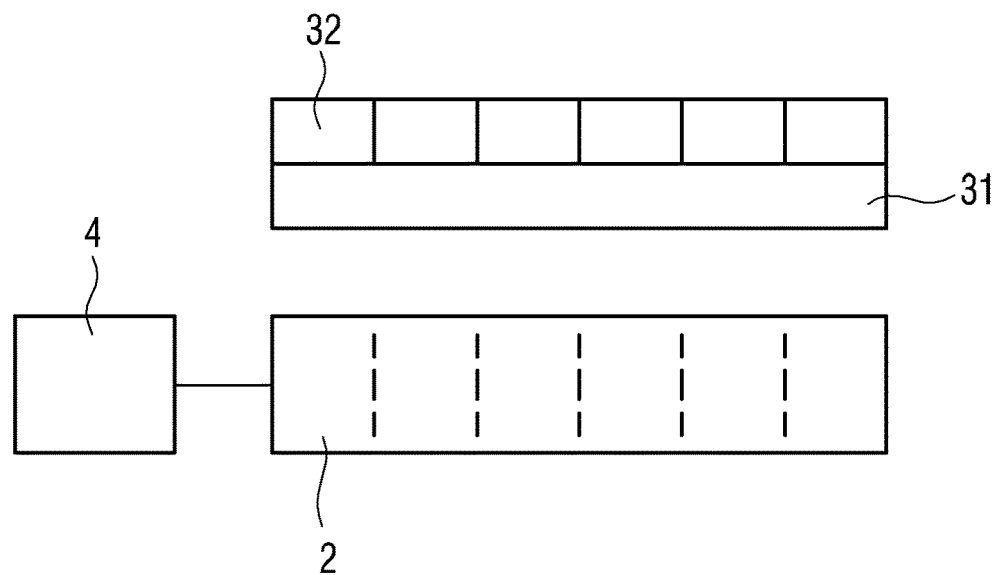
FIGS. 10A and 11A show schematic sectional illustrations of exemplary embodiments of semiconductor light sources and spectrometers described here.
FIGS. 10B and 11B show schematic illustrations of spectral properties of exemplary embodiments of semiconductor light sources described here.
Figure 10:
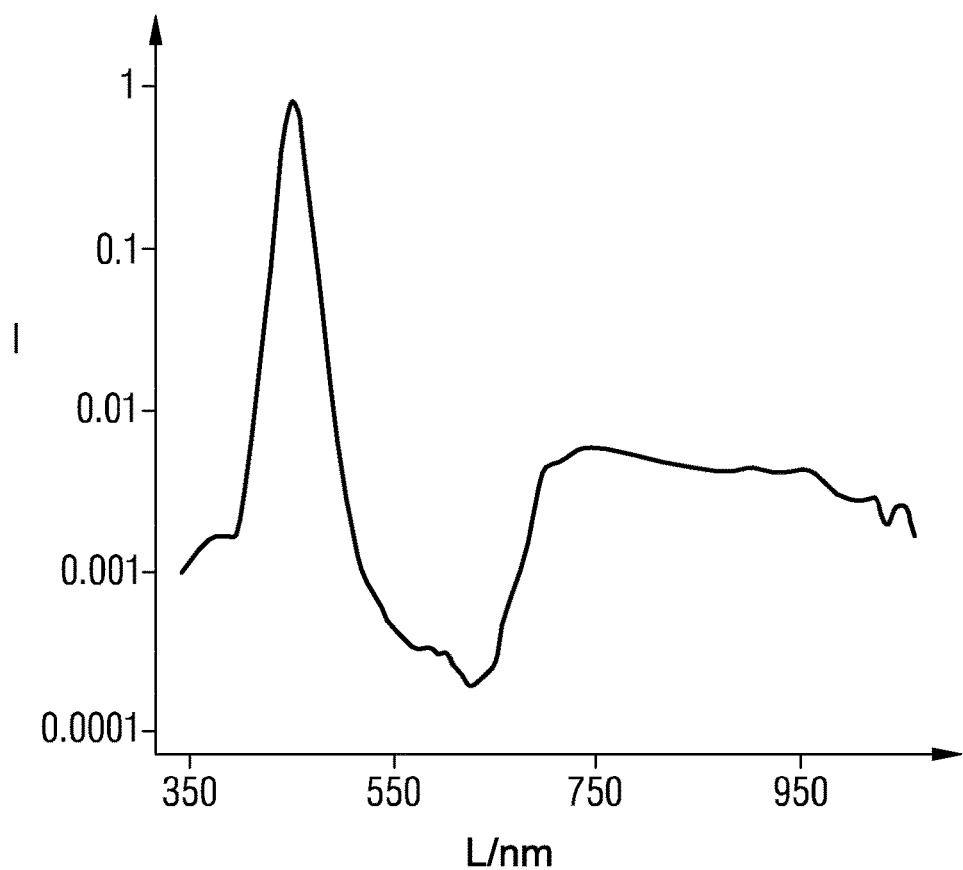

FIG. 10A shows a further exemplary embodiment of a semiconductor light source 1. The continuous phosphor layer 31 is disposed downstream of the multipixel chip 2 and generates in spectrally broadband fashion red light and near infrared radiation from blue light from the multipixel chip 2. The phosphor layer 31 can be arranged at a distance from the multipixel chip 2. The pixelated color filters 32 having the different, spectrally narrowband passbands for the individual spectra succeed the phosphor layer 31. As also in all other exemplary embodiments, it is possible that the drive unit is electrically connected to the multipixel chip 2, but can be arranged spatially comparatively independently thereof.

The associated emission spectrum of the multipixel chip 2 and of the phosphor layer 31 is shown in FIG. 10B. The relative intensity I is plotted logarithmically against the wavelength L.

The multipixel chip 2 is for example a pixelated variant of the LED chip OSRAM OS SFH 4735 or SFH 4736. The phosphor in the phosphor layer 31 is, in particular, Cr-doped lanthanum gallogermanate, $La_3Ga_5GeO_{14}$:Cr.

Figure 11:
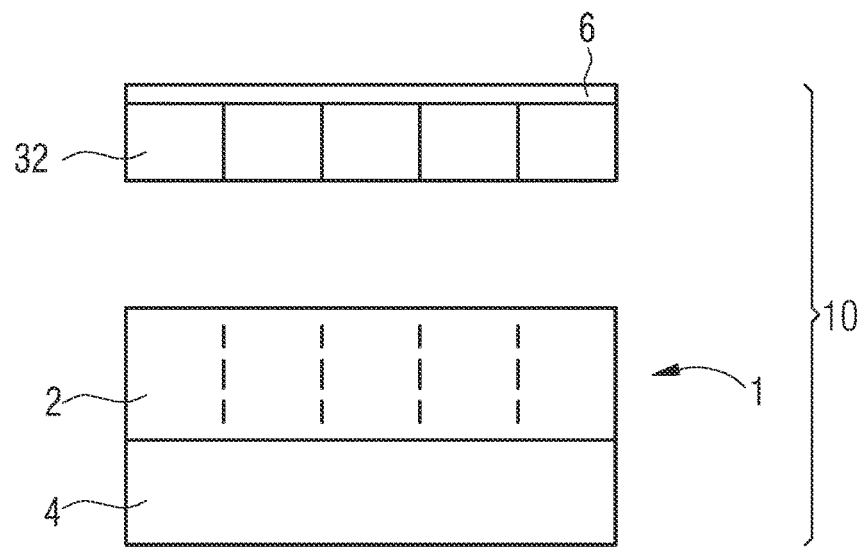
Figure 11:
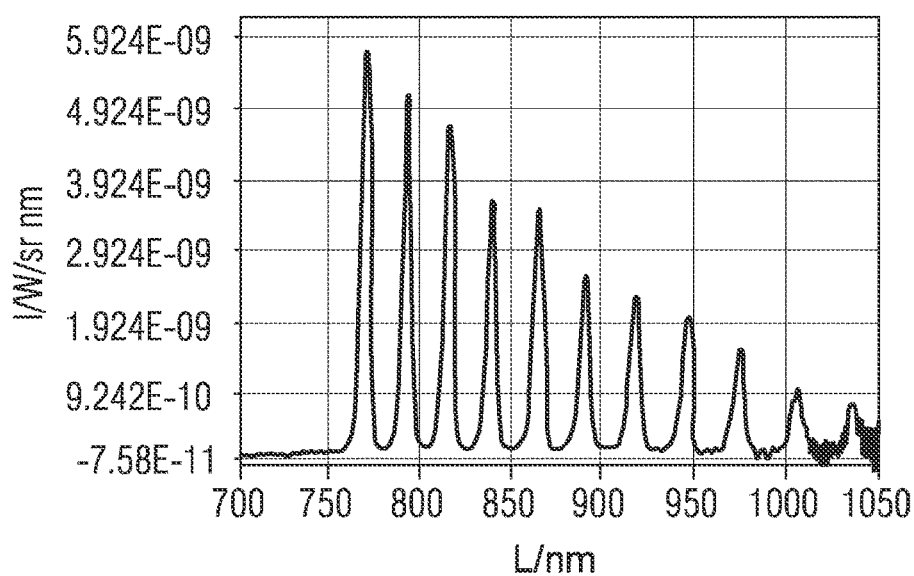

In the exemplary embodiment of the spectrometer in FIG. 11A, the multipixel chip 2 is formed by an array of vertically emitting laser units, VCSELs for short. The laser units are drivable independently of one another. On the detector side, the detector chip 6 is optionally provided with color filters 32. The laser units have emission wavelengths that are tuned to the passbands of the color filters 32 upstream of the detector chip 6. Thus, a high proportion of the radiation generated in the laser units, after reflection at an object (not depicted in FIG. 11A), is transmitted through the color filters 32 in the direction toward the detector chip 6. The laser units and/or the color filters 32 are arranged in a 3 4 matrix, for example, as seen in plan view.

Optionally, such color filters are also situated in front of the laser units, not depicted. If an emission of the laser units is already sufficiently spectrally narrowband, for example on account of a configuration of the resonators of the laser units, then color filters directly downstream of the laser units are omitted.

FIG. 11B shows the transmission spectra of the color filters 32. Non-limiting support wavelengths of the for example twelve color filters 32 are likewise indicated. A spectral full width at half maximum, FWHM for short, is approximately 10 nm for all the color filters 32. The emission spectra of the VCSELs are tuned to the transmission spectrum, such that the wavelength emission exhibits the same characteristic as the filter transmission.

If the emission spectra of the VCSEL are tuned to the filter curves and the individual VCSEL units are individually driven temporally successively, then filtering can also be completely dispensed with and single-chip detectors can be used.

The VCSELs are constructed for example as described in the documents DE 10 2017 130 582 A1 or DE 10 2018 104 785 A1. The disclosure content of said documents with regard to the construction of the VCSELs is incorporated by reference.

As a result of the use of VCSELs for the multipixel chips 2, a significantly increased efficiency of the semiconductor light source 1 in particular in the desired IR spectral range is achievable by virtue of the avoidance of conversion losses and the Stokes shift. Moreover, a significantly more directional emission profile is possible as a result of the use of the VCSELs in contrast to a Lambertian emitter search an LED. As a result, additional optical units for beam collimation can be avoided, which entails cost advantages.

A many times higher optical output power of the semiconductor light source 1 using VCSELs in the desired spectral range is achievable overall. It is thus possible to realize larger distances in the application between the semiconductor light source 1 and the reflection object to be examined. Higher market acceptance and simpler and also more reliable handling by the user are thus possible. New fields of application such as, for example, in automated plant monitoring and in foodstuffs monitoring can be opened up as a result.

The components shown in the figures, unless indicated otherwise, follow one another directly in each case in the indicated order. Layers that are not touching in the figures are at a distance from one another. Insofar as lines are drawn parallel to one another, the corresponding surfaces are likewise oriented parallel to one another. Likewise, unless indicated otherwise, the relative positions of the depicted components with respect to one another are rendered correctly in the figures.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

1 Semiconductor light source
2 Multipixel chip
20 Emission region
21 Semiconductor layer sequence
22 active zone
29 unpixelated light emitting diode chip
31 Color setting means—phosphor layer
32 Color setting means—color filter
33 optical isolation
34 Intermediate carrier
4 Drive unit
5 Group of emission regions
6 Detector chip
7 Evaluation electronics
8 Reflection object (foodstuffs, skin)
9 Smartphone
10 Spectrometer
11 Lens
12 Broadband light source
13 dispersive optical element
14 Diaphragm/spatial filter
15 Transmission object
E spectrally narrowband individual spectrum
G Total spectrum
I Intensity
L Wavelength
R Radiation

The invention claimed is:

1. A semiconductor light source configured for a spectrometer comprising:
at least one multipixel chip comprising a plurality of mutually independently drivable emission regions;
at least one color setting component disposed optically downstream of at least one of the emission regions or is integrated into the plurality of mutually independently drivable emission regions, and wherein the at least one color setting component is configured for altering a spectral emission behavior of a corresponding emission region of the plurality of mutually independently drivable emission regions; and
a drive unit configured to operate the plurality of mutually independently drivable emission regions successively, such that during operation at least three spectrally narrowband individual spectra are emitted successively by the plurality of mutually independently drivable emission regions together with the associated color setting component, from which a total spectrum is emitted by the semiconductor light source.

2. The semiconductor light source as claimed in claim 1,
wherein the color setting component comprises a phosphor layer extending continuously over the plurality of mutually independently drivable emission regions, and wherein the phosphor layer is disposed downstream of the at least one multipixel chip,
wherein the color setting component comprises a plurality of color filters; wherein each color filter of the plurality of color filters is assigned to each individual emission region of the plurality of mutually independently drivable emission regions; and wherein the plurality of color filters succeed the phosphor layer to where the color filters define the individual spectra, and
wherein the color setting component of said multipixel chip is constituted from the phosphor layer and from the plurality of color filters.

3. The semiconductor light source as claimed in claim 1,
wherein the color setting component further comprises a plurality of phosphor layers;
wherein each phosphor layer of the plurality of phosphor layers is assigned to each individual emission region of the plurality of mutually independently drivable emission regions of the at least one multipixel chip, such that the plurality of phosphor layers define the individual spectra.

4. The semiconductor light source as claimed in claim 1,
wherein the plurality of mutually independently drivable emission regions of the at least one multipixel chip are combined to form a plurality of groups,
wherein the color setting component comprises a continuous phosphor layer assigned to each group of the plurality of groups, such that the phosphor layers are arranged next to one another across the at least one multipixel chip,
wherein the color setting component comprises a plurality of color filters respectively assigned to each individual emission region of the plurality of mutually independently drivable emission regions succeed the phosphor layers of the groups, such that the plurality of color filters define the individual spectra, and
wherein the color setting component of said multipixel chip comprises the phosphor layers and from the plurality of color filters.

5. The semiconductor light source as claimed in claim 1,
wherein the at least one multipixel chip comprises a plurality of multipixel chips,
wherein at least some of the multipixel chips of the plurality of multipixel chips are configured for emission in different wavelength ranges, wherein the color setting component comprises at least one color filter; in each case at least one color filter succeeds the plurality of mutually independently drivable emission regions of said multipixel chips, such that the at least one color filter defines the individual spectra, and wherein the color setting component comprises the at least one color filter.

6. The semiconductor light source as claimed in claim 1,
wherein the at least one multipixel chip comprises a plurality of multipixel chips,
wherein at least some of the multipixel chips are configured for emission in different wavelength ranges,
wherein the color setting component comprises a plurality of color filters and a plurality of phosphor layers that are situated next to one another and are disposed downstream of the plurality of mutually independently drivable emission regions of said multipixel chips, and wherein the plurality of color filters are assigned to each of the phosphor layers emission region by emission region, such that the color filters define the individual spectra, and
wherein the color setting component of said multipixel chips comprises the phosphor layers and the color filters.

7. The semiconductor light source as claimed in claim 1,
wherein a spectral width of the individual spectra ranges from 2 nm to 10 nm inclusive and/or between 300 cm$^{-1}$ and 50 cm$^{-1}$,
wherein the total spectrum ranges from 40 to 520 individual spectra.

8. The semiconductor light source as claimed in claim 1,
wherein the at least one multipixel chip is configured for generating near infrared and short-wave infrared radiation and the total spectrum extends continuously at least over the spectral range from 650 nm to 1.3 µm inclusive,
wherein a thickness of the semiconductor light source ranges from 0.1 mm to 5 mm inclusive and a basic area of the semiconductor light source as seen in plan view is at most 5 mm×5 mm.

9. The semiconductor light source as claimed in claim 1,
wherein the at least one multipixel chip is configured for generating blue light and the total spectrum extends continuously at least over the spectral range from 450 nm to 580 nm inclusive.

10. The semiconductor light source as claimed in claim 1,
wherein the at least one multipixel chip comprises at least two multipixel chips configured to emit in mutually different wavelength ranges,
wherein within each multipixel chip all of the plurality of mutually independently drivable emission regions are provided for generating radiation in the same wavelength range.

11. The semiconductor light source as claimed in claim 1,
wherein the drive unit is the mechanically carrying and supporting component, such that the drive unit contributes to a total thickness of the semiconductor light source ranging from 30% to 70%.

12. The semiconductor light source as claimed in claim 1,
wherein the at least one multipixel chip comprises a semiconductor layer sequence having an active zone for generating radiation,
wherein the semiconductor layer sequence and/or the active zone extend(s) continuously over the plurality of mutually independently drivable emission regions of the relevant multipixel chip.

13. The semiconductor light source as claimed in claim 1,
wherein the plurality of mutually independently drivable emission regions, as seen in plan view, each have dimensions ranging from 10 µm×10 µm to 50 µm×50 µm, wherein at least 25 and at most 1000 of the plurality of mutually independently drivable emission regions are present per multipixel chip.

14. The semiconductor light source as claimed in claim 1,
further comprising a light emitting diode chip having a single channel and provided for generating one of the individual spectra.

15. The semiconductor light source as claimed in claim 1,
wherein the at least one multipixel chip comprises a plurality of vertically emitting laser units configured for emitting radiation of different wavelengths of maximum intensity, wherein the color setting component is formed by resonators of the laser units.

16. An operating method for a semiconductor light source as claimed in claim 1,
wherein the at least one multipixel chip is operated by the drive unit such that the at least three spectrally narrow-band individual spectra are emitted successively, such that the total spectrum emitted by the semiconductor light source is constituted from the individual spectra.

17. A spectrometer comprising:
at least one semiconductor light source as claimed in claim 1, and
at least one detector chip for sequentially detecting radiation of the individual spectra,
wherein the radiation is at least partly in the near infrared spectral range, and
wherein a spectral resolution of the detector chip together with the semiconductor light source is 30 nm or less.

18. The spectrometer as claimed in claim 17,
wherein the at least one detector chip is a photodiode,
wherein the photodiode is based on the material system InGaAs or Ge and is configured for detecting radiation up to at least 1.3 µm, and
wherein the spectral resolution of the detector chip together with the semiconductor light source is 8 nm or less.

19. The spectrometer as claimed in claim 17,
wherein the spectrometer is free of movable components.

20. A smartphone comprising the spectrometer as claimed in claim 17.

* * * * *